United States Patent
Umstadter (10) Patent No.: US 10,128,016 B2
(45) Date of Patent: Nov. 13, 2018

(54) EUV ELEMENT HAVING BARRIER TO HYDROGEN TRANSPORT

(71) Applicant: ASML Netherlands B.V., Veldhoven (NL)

(72) Inventor: Karl Robert Umstadter, San Diego, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 15/338,835

(22) Filed: Oct. 31, 2016

(65) Prior Publication Data
US 2017/0200523 A1    Jul. 13, 2017

Related U.S. Application Data (60) Provisional application No. 62/277,807, filed on Jan. 12, 2016, provisional application No. 62/278,923, filed on Jan. 14, 2016.

(51) Int. Cl.
*G21K 1/06* (2006.01)
*G02B 19/00* (2006.01)
(Continued)

(52) U.S. Cl.
CPC ......... *G21K 1/062* (2013.01); *G02B 19/0095* (2013.01); *G03F 1/24* (2013.01);
(Continued)

(58) Field of Classification Search
CPC .......... H05G 2/00; H05G 2/003; H05G 2/005; H05G 2/006; H05G 2/008; G02B 19/0095;
(Continued)

(56) References Cited

U.S. PATENT DOCUMENTS

| | | | |
|---|---|---|---|
| 2001/0021554 A1* | 9/2001 | Hopfner | H01L 21/3105 438/253 |
| 2004/0002009 A1 | 1/2004 | Yan | |
| 2004/0214430 A1* | 10/2004 | Ruelke | H01L 21/3105 438/687 |
| 2004/0223531 A1 | 11/2004 | Arenberg | |

(Continued)

FOREIGN PATENT DOCUMENTS

| | | |
|---|---|---|
| DE | 102011077983 A1 | 12/2012 |
| DE | 102012207125 A1 | 3/2013 |

OTHER PUBLICATIONS

PCT/US2018/062618 International Search Report and Written Opinion dated Mar. 17, 2017.

*Primary Examiner* — David E Smith
(74) *Attorney, Agent, or Firm* — Arent Fox LLP (57) ABSTRACT

Disclosed is an EUV system element having a hydrogen diffusion barrier including a region implanted with species (e.g., ions energetic neutral atoms) of a non-hydrogen gaseous material. Also disclosed is a method of making such a component including the step of implanting species of a non-hydrogen gaseous material to form a hydrogen diffusion barrier and a method of treating an EUV system element including the step of implanting species of a non-hydrogen gaseous material to prevent hydrogen adsorption and diffusion. Also disclosed is subjecting an EUV system element to a flux of non-hydrogen gas ions to displace hydrogen ions in one or more layers of the EUV system element with the non-hydrogen gas species so that the gas ions protect the EUV system element against hydrogen damage.

43 Claims, 6 Drawing Sheets (51) Int. Cl.
*G03F 1/24* (2012.01)
*G03F 7/20* (2006.01)
*H05G 2/00* (2006.01)

(52) U.S. Cl.
CPC ...... *G03F 7/70033* (2013.01); *G03F 7/70175* (2013.01); *G03F 7/70916* (2013.01); *G03F 7/70958* (2013.01); *H05G 2/008* (2013.01)

(58) Field of Classification Search
CPC ....... G21K 1/062; G03F 1/24; G03F 7/70033; G03F 7/70175; G03F 7/70916; G03F 7/70958
See application file for complete search history.

(56) References Cited

U.S. PATENT DOCUMENTS

| | | | |
|---|---|---|---|
| 2005/0287801 A1* | 12/2005 | Jin | H01L 21/76825 438/672 |
| 2008/0026545 A1* | 1/2008 | Cooke | H01L 21/0237 438/478 |
| 2008/0179548 A1 | 7/2008 | Bykanov et al. | |
| 2010/0328639 A1* | 12/2010 | Jak | G02B 5/204 355/71 |
| 2012/0313016 A1 | 12/2012 | Fleurov et al. | |
| 2014/0098413 A1* | 4/2014 | Ershov | G02B 5/0891 359/359 |
| 2015/0202564 A1* | 7/2015 | Kirby | B01D 53/228 95/56 |
| 2016/0187543 A1* | 6/2016 | Bekman | G02B 1/14 359/360 |
| 2016/0349412 A1 | 12/2016 | Bowering | |

\* cited by examiner

EUV ELEMENT HAVING BARRIER TO HYDROGEN TRANSPORT

CROSS REFERENCE TO RELATED APPLICATIONS

The application claims priority to U.S. patent application No. 62/277,807 filed Jan. 12, 2016 and U.S. patent application No. 62/278,923 filed Jan. 14, 2016.

FIELD

The present disclosure relates to elements designed to operate in environments in which they exposed to substances such as hydrogen that can damage the element. An example of such an environment is the vacuum chamber of an apparatus for generating extreme ultraviolet ("EUV") radiation from a plasma created through discharge or laser ablation of a target material. In this application, optical elements are used, for example, to collect and direct the radiation for utilization, e.g., in semiconductor photolithography and inspection.

BACKGROUND

Extreme ultraviolet radiation, e.g., electromagnetic radiation having wavelengths of around 50 nm or less (also sometimes referred to as soft x-rays), and including radiation at a wavelength of about 13.5 nm, can be used in photolithography processes to produce extremely small features in substrates such as silicon wafers.

Methods for generating EUV radiation include converting a target material from a liquid state into a plasma state. The target material preferably includes at least one element, e.g., xenon, lithium or tin, with one or more emission lines in the EUV range. The target material can be solid, liquid or gas. In one such method, often termed laser produced plasma ("LPP"), the required plasma can be produced by using a laser beam to irradiate a target material having the required line-emitting element.

One LPP technique involves generating a stream of target material droplets and irradiating at least some of the droplets with laser radiation pulses. In more theoretical terms, LPP sources generate EUV radiation by depositing laser energy into a target material having at least one EUV emitting element, such as xenon (Xe), tin (Sn), or lithium (Li), creating a highly ionized plasma with electron temperatures of several 10's of eV.

The energetic radiation generated during de-excitation and recombination of these ions is emitted from the plasma in all directions. In one common arrangement, a near-normal-incidence mirror (often termed a "collector mirror" or simply a "collector") is positioned to collect, direct, and, in some arrangements, focus the radiation to an intermediate location. The collected radiation may then be relayed from the intermediate location to a set of optics, a reticle, detectors and ultimately to a wafer.

In the EUV portion of the spectrum it is generally regarded as necessary to use reflective optics for the optical elements in the system including the collector, illuminator, and projection optics box. These reflective optics may be implemented as normal incidence optics or grazing incidence optics. At the wavelengths involved, the collector is advantageously implemented as a multi-layer mirror ("MLM"). As its name implies, this MLM is generally made up of alternating layers of material (the MLM stack) over a foundation or substrate. System optics may also be configured as a coated optical element even if it is not implemented as an MLM.

The optical element must be placed within the vacuum chamber with the plasm to collect and redirect the EUV radiation. The environment within the chamber is inimical to the optical element and so limits its useful lifetime, for example, by degrading its reflectivity. An optical element within the environment may be exposed to high energy ions or particles of target material. The particles of target material can contaminate the optical element's exposed surface. Particles of target material can also cause physical damage and localized heating of the MLM surface. The target materials may be particularly reactive with a material making up at least one layer of the optical element surface, e.g., molybdenum and silicon. Temperature stability, ion-implantation, and diffusion problems may need to be addressed even with less reactive target materials, e.g., tin, indium, or xenon. Blistering of the MLM coating must also be avoided.

There are techniques which may be employed to increase optical element lifetime despite these harsh conditions. For example, a capping layer may be placed on the optical element to protect the surface of the optical element. To make the capping layer more reflective it may also have multiple layers spaced to increase reflectivity at the wavelength of the radiation to be reflected. Such multilayer capping layers are, however, themselves prone to damage through mechanisms such as hydrogen diffusion and blistering.

In some systems $H_2$ gas at pressures in the range of 0.5 to 3 mbar is used in the vacuum chamber for debris mitigation. In the absence of a gas, at vacuum pressure, it would be difficult if not impossible to protect the collector adequately from target material debris ejected from the plasma. Hydrogen is relatively transparent to EUV radiation having a wavelength of about 13.5 nm and so is preferred to other candidate gases such as He, Ar, or other gases which exhibit a higher absorption at about 13.5 mm.

$H_2$ gas is introduced into the vacuum chamber to slow down the energetic debris (ions, atoms, and clusters) of target material created by the plasma. The debris is slowed down by collisions with the gas molecules. For this purpose a flow of $H_2$ gas is used which may also be counter to the debris trajectory. This serves to reduce the damage of deposition, implantation, and sputtering target material on the optical coating of the collector. Using this method it is believed possible to slow down energetic particles with energies of several keV to a few tens of eV by the many gas collisions over the distance between the plasma site and the collector surface.

Another reason for introducing $H_2$ gas into the vacuum chamber is to facilitate cleaning of the collector surface. The EUV radiation generated by the plasma creates hydrogen radicals H* by dissociating the $H_2$ molecules. The hydrogen radicals H* in turn help to clean the collector surface from target material deposits on the collector surface. For example, in the case of tin as the target material, the hydrogen radicals participate in reactions on the collector surface that lead to the formation of volatile gaseous stannane ($SnH_4$) which can be pumped away. For this chemical path to be efficient it is preferred that there is a low H recombination rate (to form back into $H_2$ molecules) on the collector surface so that the hydrogen radicals are available instead for attaching to the Sn to form $SnH_4$. Generally, a surface consisting of non-metallic compounds such as nitrides, carbides, borides and oxides has a lower H recombination rate as compared to a surface consisting of pure metals.

The use of $H_2$ gas, however, can have a negative effect on a coating applied to the collector caused by both the light hydrogen atoms and molecules on the coating. It is believed that the hydrogen atoms are so small that they can easily diffuse several layers deep into a collector configured as a multilayer mirror. Low energy hydrogen can also be implanted near the surface and can diffuse into the collector cap and layers of the multilayer mirror beneath the cap. These phenomena most severely affect outermost layers (e.g., the first 1 µm).

Once atomic hydrogen invades the body of the multilayer mirror it can bond to Si, get trapped at layer boundaries and interfaces, or both. Hydrogen can diffuse through the MLM stack to the bonding layer below and even to the substrate. The magnitude of these effects depends on the fluence of hydrogen to the surface, the hydrogen dose absorbed, and the concentration of hydrogen in these regions. If the hydrogen concentration is above a certain threshold it can form bubbles of gaseous hydrogen compounds, either recombining to $H_2$ molecules or perhaps also forming hydrides. This can happen most severely typically underneath the MLM stack or in the substrate layer. When a gas bubble starts to form there is a high probability that it will grow in the presence of additional hydrogen. If such bubbles do form then their internal gas pressure will deform the layer above the bubble, leading to the formation of blisters on the coating of various sizes. The layer may then burst, thus releasing the gas below and material above this, area, resulting in delamination of the coating.

A blistered coating creates several problems. It has a higher surface area and is more prone to degradation by oxidation and other contaminants and by deposition of target material. Due to higher absorption this generally leads to a reduction of EUV reflectance. A blistered coating also scatters more light due to higher roughness and thus leads to significantly reduced EUV reflectance at desired angles, even though the undamaged layers below still contribute to reflection of EUV light and even if the target material deposits are removed by cleaning. Blisters also cause a change in reflection of out-of-band (OoB) light which can include light generated by the plasma as well as light from the drive laser and the loss of effectiveness of elements such as gratings used to deliberately scatter light from the drive laser.

Collector blistering due to H* exposure severely limits lifetime and greatly impacts system availability. A current model, for damage is H* adsorption at the surface where defects are present and transport of H atoms to regions within the bulk. A primary indication is that this occurs below the MLM stack in the adherence layer. H* generation scales with EUV power so the problem of EUV MLM optical element blistering can be expected to grow worse as the power of the source increases.

In addition to these effects, hydrogen uptake and penetration can also lead to embrittlement of metal layers and thus cause layer degradation.

There thus is a need to exploit the advantages with respect to enhancing the EUV reflectance of using a multilayer optic while at the same time having an optic that is resistant to hydrogen damage such as blistering.

SUMMARY

The following presents a simplified summary of one or more embodiments in order to provide a basic understanding of the embodiments. This summary is not an extensive overview of all contemplated embodiments and is not intended to identify key or critical elements of all embodiments nor set limits on the scope of any or all embodiments. Its sole purpose is to present some concepts of one or more embodiments in a simplified form as a prelude to the more detailed description that is presented later.

According to one aspect, what is disclosed is an apparatus comprising a component of a system for generating EUV radiation, the component being exposed to hydrogen ions during operation of the system for generating EUV radiation, the component including a hydrogen diffusion barrier comprising a region implanted with species (e.g., ions or energetic neutral atoms) of a non-hydrogen gas. As used here and elsewhere in this description and in the claims "non-hydrogen gas" means a gas which is made up primarily of a gas or gasses other than hydrogen. The non-hydrogen gas comprise helium. The component may comprise at least a portion of a collector mirror, which may be a normal incidence mirror and which may be a multilayer mirror. The component may also be at least a portion of one of a reticle, a detector, a microscope, an inspection system, a pellicle, a vacuum chamber liner, a vacuum chamber vane, and a droplet generator.

According to another aspect, what is disclosed is a multilayer mirror for use in a system for generating EUV radiation, the multilayer mirror being exposed to hydrogen ions during operation of the system for generating EUV radiation, the multilayer mirror comprising a substrate, a backing layer on the substrate, and a multilayer coating on the hacking layer, wherein one of the backing layer and the multilayer coating includes a hydrogen diffusion barrier comprising a region implanted with species of a non-hydrogen gas. The non-hydrogen gas may comprise an inert gas, which may be helium.

According to another aspect, what is disclosed is a multilayer mirror for use in a system for generating EUV radiation, the multilayer mirror being exposed to hydrogen ions during operation of the system for generating EUV radiation, the multilayer mirror comprising a substrate and a coating on the substrate, the coating comprising a plurality of layers wherein at least one layer of the plurality of layers is implanted with a species of an inert gas. The non-hydrogen gas may comprise an inert gas, which may be helium.

According to another aspect, what is disclosed is an apparatus for semiconductor photolithography comprising a laser radiation source, a target delivery system for delivering target material to an irradiation region where the target material is irradiated by the laser radiation source to produce extreme ultraviolet radiation, and a reflective optical element arranged to collect the extreme ultraviolet radiation, the reflective optical element comprising a multilayer mirror including a multilayer stack and a backing layer, wherein at least one of the multilayer stack and the backing layer include a hydrogen diffusion barrier comprising a region implanted with species of an inert gas which may be helium.

According to another aspect, what is disclosed is a method of making component of a system for generating EUV radiation, the component being exposed to hydrogen ions during operation of the system for generating EUV radiation, the method comprising the step of implanting species of a non-hydrogen gas in at least a portion of the component to form a hydrogen diffusion barrier in the component. The non-hydrogen gas may comprise helium. The implanting step may comprise controlling the implantation energy of the species to control an average depth of the hydrogen diffusion barrier in the component.

According to another aspect, what is disclosed is a method of treating a multilayer mirror for use in a system for generating EUV radiation, the multilayer mirror being exposed to hydrogen ions during operation of the system for generating EUV radiation, the method comprising the steps of removing a multilayer coating of the multilayer mirror to expose a backing layer, implanting species of a non-hydrogen gas in the backing layer, and placing a multilayer coating on the backing layer. The non-hydrogen gas may comprise an inert gas, which may comprise helium. The implanting step may comprises controlling the implantation energy of the species to control an average implantation depth of the species in the backing layer According to another aspect, what is disclosed is a method of treating an EUV optical element for use in a system for generating EU V radiation, the EUV optical element being exposed to hydrogen ions during operation of the system for generating EUV radiation, the method comprising the step of implanting species of a non-hydrogen gas in the EUV optical element to prevent hydrogen adsorption and diffusion in the EUV optical element. The non-hydrogen gas may comprise an inert gas which may be helium. The implanting step may comprise controlling the implantation energy of the species to control an average implantation depth of the species in the component.

According to another aspect, what is disclosed is a method of treating component for use in a system for generating EUV radiation, the component having been exposed to hydrogen ions during operation of the system for generating EUV radiation, the method comprising the step of subjecting the component to a flux of non-hydrogen gas species to displace hydrogen ions in at least a portion of the component with the non-hydrogen gas species so that the non-hydrogen gas species protect the multilayer EUV optical element against hydrogen damage. The non-hydrogen gas may comprise an inert gas which may be helium.

DETAILED DESCRIPTION

Various embodiments are now described with reference to the drawings, wherein like reference numerals are used to refer to like elements throughout. In the following description, for purposes of explanation, numerous specific details are set forth in order to promote a thorough understanding of one or more embodiments. It may be evident in some or all instances, however, that any embodiment described below can be practiced without adopting the specific design details described below. In other instances, well-known structures and devices are shown in block diagram form in order to facilitate description of one or more embodiments.

Figure 1:
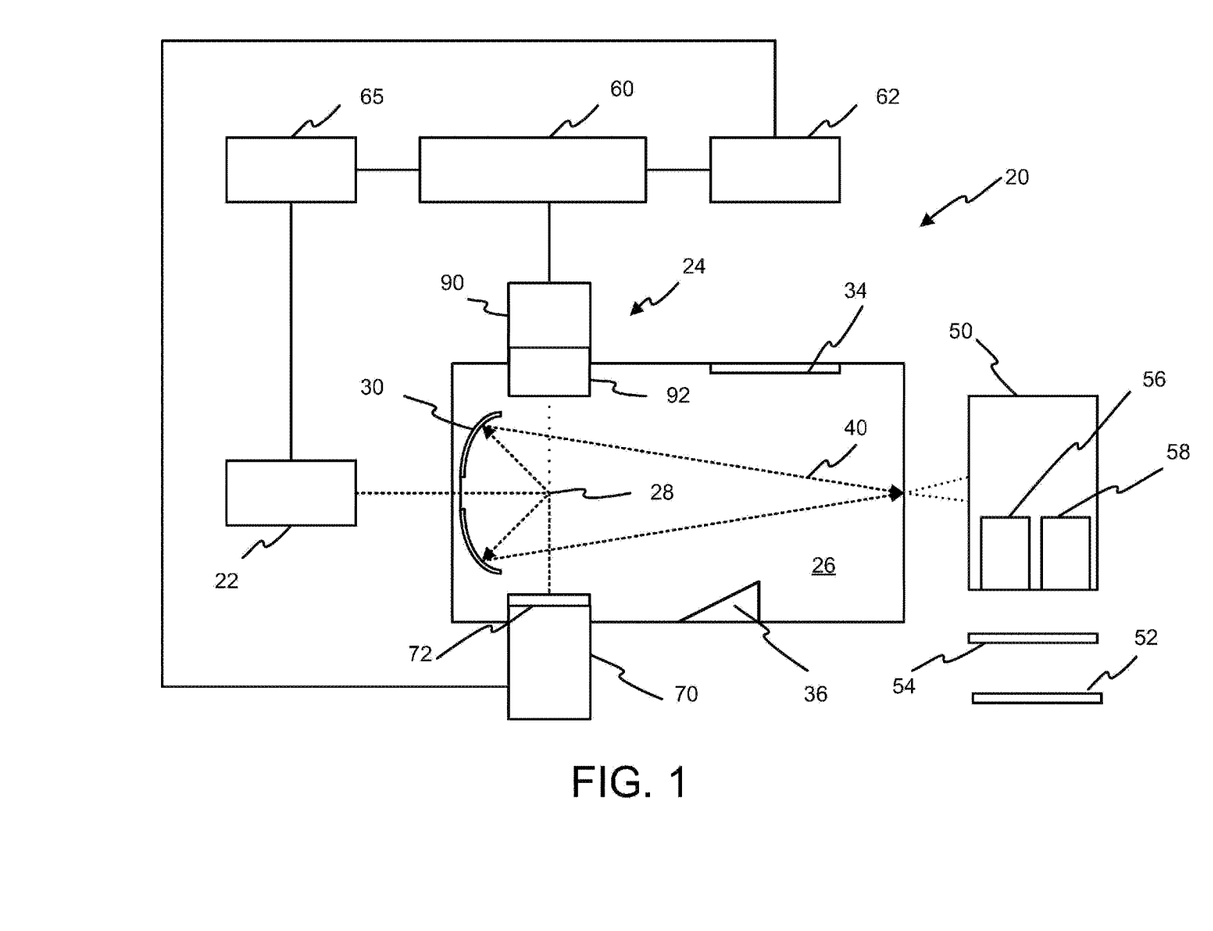
FIG. 1 shows a schematic, not-to-scale view of an overall broad conception for a laser-produced plasma EUV radiation source system according to an aspect of the present invention.

With initial reference to FIG. 1 there is shown a schematic view of, an exemplary EUV radiation source, e.g., a laser produced plasma EUV radiation source 20 according to one aspect of an embodiment of the present invention. As shown, the EUV radiation source 20 may include a pulsed or continuous laser source 22, which may for example be a pulsed gas discharge $CO_2$ laser source producing radiation at 10.6 μm or 1 μm. The pulsed gas discharge $CO_2$ laser source may have DC or RF excitation operating at high power and at a high pulse repetition rate.

The EUV radiation source 20 also includes a target delivery system 24 for delivering target material in the form of liquid droplets or a continuous liquid stream. In this example, the target material is a liquid, but it could also be a solid or gas. The target material may be made up of tin or a tin compound, although other materials could be used. The target material delivery system 24 introduces the target material into the interior of a vacuum chamber 26 to an irradiation region 28 where the target material may be irradiated to produce plasma. In some cases, an electrical charge is placed on the target material to permit the target material to be steered toward or away from the irradiation region 28. It should be noted that as used herein an irradiation region is a region where target material irradiation may occur, and is an irradiation region even at times when no irradiation is actually occurring. The vacuum chamber 26 may be provided with a liner 34 and may have a series of vanes 36.

The EUV light source 20 may also include an EUV light source controller system 60, which may also include a laser firing control system 65, along with, e.g., a laser beam positioning system (not shown). The EUV light source 20 may also include a detector such as a target position detection system which may include one or more droplet imagers 70 that generate an output indicative of the absolute or relative position of a target droplet, e.g., relative to the irradiation region 28, and provide this output to a target position detection feedback system 62. The portion of the droplet imager 70 exposed to the interior of the chamber 26 may be provided with a protective pellicle 72. The target position detection feedback system 62 may use the output of the droplet imager 70 to compute a target position and trajectory, from which a target error can be computed. The target error can be computed on a droplet-by-droplet basis, or on average, or on some other basis. The target error may then be provided as an input to the light source controller 60. In response, the light source controller 60 can generate a control signal such as a laser position, direction, or timing correction signal and provide this control signal to a laser beam positioning controller (not shown). The laser beam positioning system can use the control signal to control the laser timing circuit and/or to control a laser beam position and shaping system (not shown), e.g., to change the location and/or focal power of the laser beam focal spot within the chamber.

As shown in FIG. 1, the light source 20 may include a target delivery control system 90. The target delivery control system 90 is operable in response to a signal, for example, the target error described above, or some quantity derived from the target error provided by the system controller 60, to correct for errors in positions of the target droplets within the irradiation region 28. This may be accomplished, for example, by repositioning the point at which the target delivery mechanism 92 releases the target droplets. The target delivery mechanism 92 extends into the chamber 26 and is also externally supplied with target material and a gas source to place the target material in the target delivery mechanism 92 under pressure.

Continuing with FIG. 1, the radiation source 20 may also include one or more optical elements. In the following discussion, a collector 30 is used as an example of such an optical element, but the discussion applies to other optical elements as well. The collector 30 may be a normal incidence reflector, for example, implemented as an MLM, that is, a silicon carbide (Sin substrate coated with a bonding or backing layer and then a molybdenum/silicon (Mo/Si) multilayer stack with additional thin barrier layers, for example $B_4C$, ZrC, $Si_3Na_4$ or C, deposited at each interface to effectively block thermally-induced interlayer diffusion. Other substrate materials, such as aluminum (Al) or silicon (Si), can also be used. The collector 30 may be in the form of a prolate ellipsoid, with an aperture to allow the laser radiation to pass through and reach the irradiation region 28. The collector 30 may be, e.g., in the shape of a ellipsoid that has a first focus at the irradiation region 28 and a second focus at a so-called intermediate point 40 (also called the intermediate focus 40) where the EU V radiation may be output from the EUV radiation source 20 and input to, e.g., an integrated circuit lithography or inspection tool 50 which uses the radiation, for example, to process a silicon wafer workpiece 52 in a known manner using a reticle or mask 54. The silicon wafer workpiece 52 is then additionally processed in a known manner to obtain an integrated circuit device. The integrated circuit lithography tool 50 may include an inspection system 56 and a microscope 58.

Figure 2:
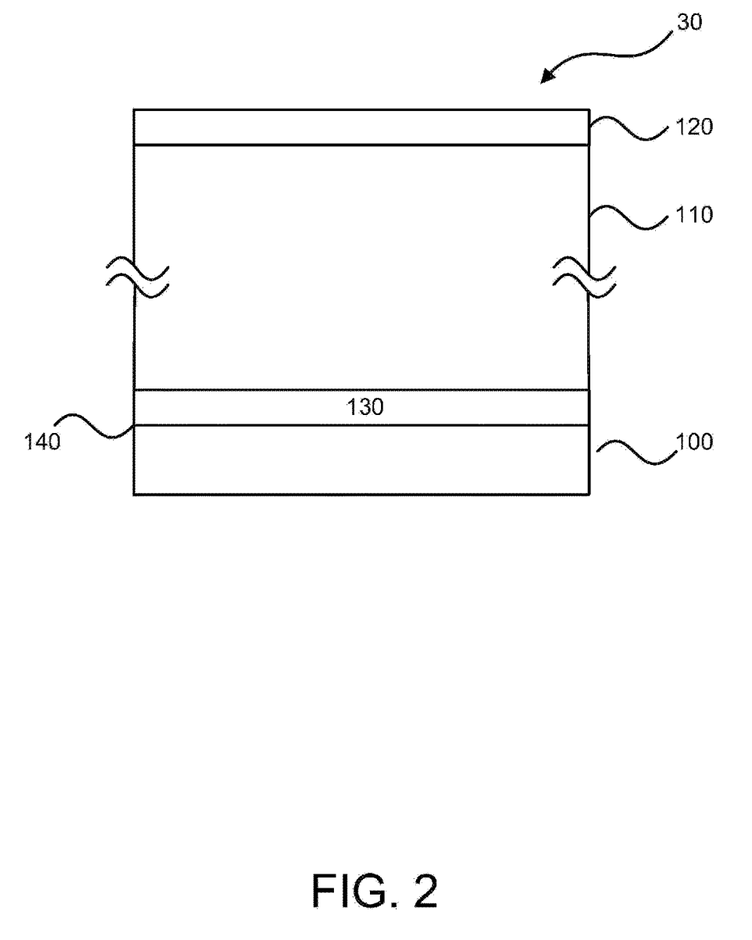
FIG. 2 is a schematic, not-to-scale diagram of a cross section of an EUV optical element having a hydrogen transport barrier.

An example of an MLM collector 30 is shown in FIG. 2 which is a cross section though a portion of such a collector. As can be seen there, the collector 30 includes a substrate 100. A multilayer stack 110 is located on the substrate 100. The multilayer stack 110 is made up of a stack of alternating layers of material, for example, molybdenum and silicon, in a known fashion. Located on the multilayer coating 110 is a capping layer 120 which is typically made up of an outermost layer and a series of repeating bilayers. There is a bonding or backing layer 130 between the substrate 100 and the multilayer stack 110.

Referring again to FIG. 2, the topmost layer of the cap 120 is preferably a nitride or oxide with high resistance to target material deposition. In effect, these are preferably materials having a low recombination rate for atomic hydrogen to enable a high formation rate of stannane. These would typically be materials having a hydrogen recombination coefficient in a range of about $10^{-4}$ to about $10^{-3}$. Effectively this means the preferred material exhibits a good tin cleaning rate since the H can react with Sn before it recombines to $H_2$. As an example, the metal stainless steel has a recombination coefficient of $2.2 \times 10^{-3}$. A preferred material for the topmost layer 130 of the cap 120 also preferably exhibits good energy reduction for incident ions and low secondary electron yield. Examples of materials having low recombination coefficients, good energy reduction for incident ions, and low secondary electron yield include ZrN, $TiO_2$, $Ta_2O_5$, and $ZrO_2$.

Atomic hydrogen adsorbed by the surface of the collector 30 can penetrate the collector 30 through imperfections in its top (outermost) layer. This hydrogen can diffuse through the backing layer 130 of the collector 30 and collect at an interface 140 between backing layer 130 and the substrate 100. Hydrogen aggregation leads to bubble formation so that gaps may grow in at the interface 140. These gaps result in surface blisters and discontinuity in the thermal conduction path between collector 30 and a cooling system (not shown) provided to cool the multilayer coating 110 by cooling the substrate 100.

In order to prevent blistering and separation of the backing layer 130 from the substrate 100 at the interface 140, according to one aspect of the invention species (ions or energetic neutrals) of a non-hydrogen gas such as helium are implanted in the backing layer 130 to prevent hydrogen diffusion into the backing layer and the amorphous silicon material of the substrate 100 effectively to prevent the blistering. As used here and elsewhere in this description and in the claims "non-hydrogen gas" means a gas which is made up primarily of a gas or gasses other than hydrogen. Helium is considered to be a good choice for implantation because it is relatively inert and immobile but other inert gases may be used. The implantation of the backing layer 130 creates a hydrogen diffusion barrier through which the diffusion or permeation of hydrogen is slowed or prevented. This hydrogen diffusion barrier may be conceptualized as simply a region of the backing layer into which the species have been implanted, or as a separate layer. The implantation energy and so the implantation depth may be selected so that hydrogen diffusion barrier is created within the backing layer 130 at the interface between the backing layer 130 and the substrate 100, or the implantation energy may be selected so that the hydrogen diffusion barrier occupies a shallower region of the backing layer 130. It will be understood that in general implantation will occur over a range of depths and that there will be an average depth for the species and hence for the hydrogen diffusion barrier.

The following discussion is in terms of helium ions as an example, but other neutral elements may be used. Also, as mentioned, energetic neutral atoms may be used instead of ions. Energetic neutral ions may be created in a number of ways. For example, high energy ions can transported though a gas where a charge exchange collision between than ion and a cold neutral atom creates a cold ion but an energetic neutral atom. In effect, the ion maintains its energy but takes electrons from the neutral atom. For helium, this charge exchange may take the form of an alpha-helium charge exchange:

$$He^{2+} + He \rightarrow He + He^{2+}$$

where the left hand side $He^{2+}$ is an energetic helium ion and the left hand side He is a cold helium atom and the right hand side He is an energetic neutral helium atom and the right hand side $He^{2+}$ is a cold helium ion. The energetic neutral helium atom may then be implanted.

Figure 3:
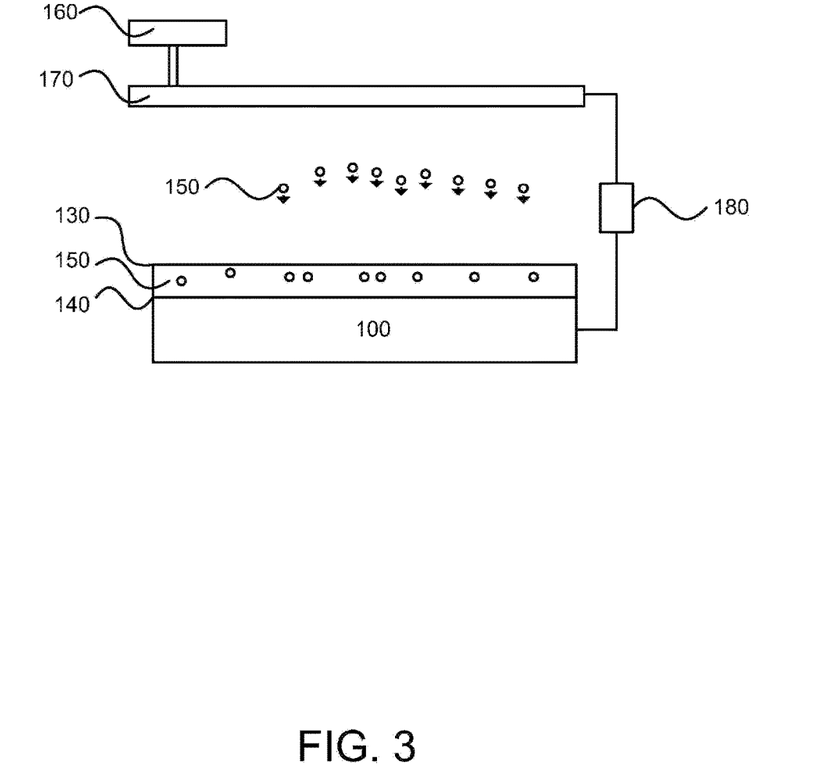
FIG. 3 is a schematic, not-to-scale diagram of a system for making an EUV optical element having a hydrogen transport barrier.

FIG. 3 shows an exemplary arrangement for fabricating an EUV optical element having an implanted backing layer. The following discussion is in terms of implanting helium ions or energetic neutrals but as noted ions or energetic neutrals of other gases may be used. As a process step during fabrication of the EUV optical element as shown, helium ions 150 are implanted into the backing layer 130. The depth of implantation can be adjusted by altering the He ion energy. He ion fluence can be adjusted by adjusting the exposure time. In addition, the flux (heat load) can be adjusted by controlling the gas density. Also, the process may involve additional steps such as thermal annealing of the substrate 100 and desorption of the substrate 100 before or after introduction of the helium species.

Figure 6:
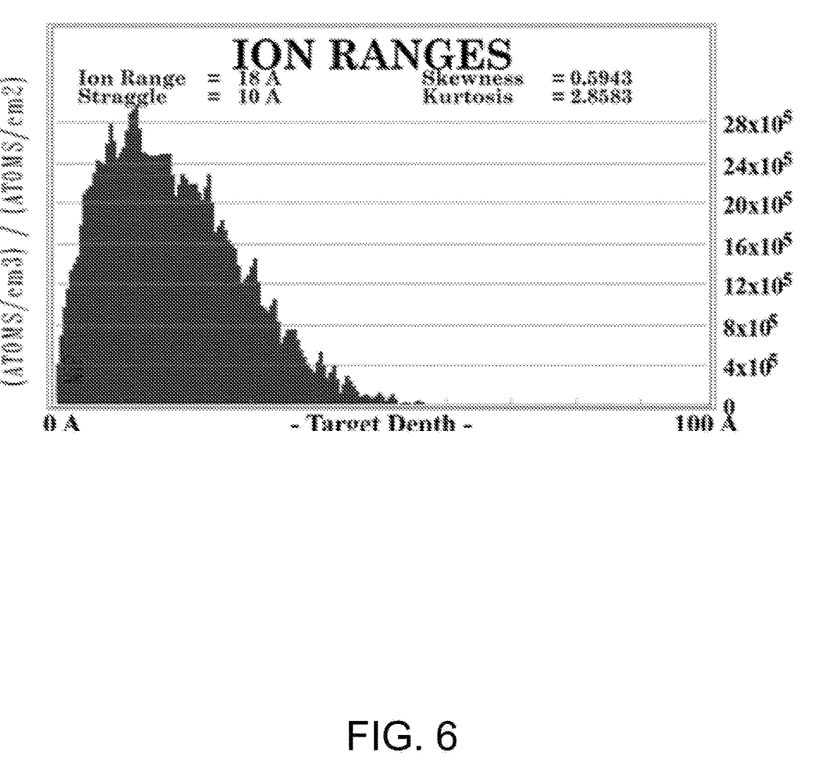
FIG. 6 is a graph depicting the results of a sample calculation of ion ranges according to an aspect of an embodiment.

The desired energy of the helium ions can be determined by a combination of modeling (simulation code, e.g., Stopping Range of Ions in Matter ("SRIM") /Transport of Ions in Matter ("TRIM") code) and experimental testing. See "SRIM - The Stopping and Range of Ions in Matter", J. F. Ziegler, M. D. Ziegler, and J. P. Biersack, Nuclear Instruments and Methods in Physics Research Section B: Beam Interactions with Materials and Atoms, Volume 268, Issues 11-12, Jun. 2010, pp. 1818-1823, the entirety of which is incorporated by reference. It is presently preferred to use helium an energy of about 100eV helium which has a range up to 5.0 nm, with the maximum ion concentration occurring at about 1.0-2.0 nm in materials with density near 5.3 g/cm3. This ion energy should cause no surface damage and puts He very near the interface between the backing layer 130 and the substrate 100. A sample calculation utilizing the TRIM code for this example is shown in FIG. 6. Experimental verification of H, H2 and He trapping/transport/penetration in materials can be obtained via nuclear reaction analysis (NRA) and thermal desorption spectroscopy (TDS).

This implantation layer can be created, for example, by introduction of He gas from a source 160 to a cathodic source 170 where it is ionoized. The ion energy is controlled by controlling the voltage gradient (bias) between the cathodic source 170 and the substrate 100 using a bias voltage source 180. This arrangement allows for large surfaces to be exposed at one time, minimizing the amount of time required to carry out the process. This process could be carried out as part of conventional coating processes. Of course, the above describes just one possible method of ion generation and implantation. It will be apparent to one of ordinary skill in the art that other methods can be used. The MLM stack 110 can be deposited following the implantation process.

This process described above can be used not only in the fabrication of new EUV optical elements but also as part of the recoating of existing EUV optical elements. This allows reuse and extended lifetime of installed collectors by treatment following MLM removal. The method is applicable to current materials used for the backing layer 130 as well as to materials that it is anticipated may be used in the future. Advanced lifecycle testing to optimize the solution can be accomplished using a plasma source where samples can be exposed to a high fluence of $H^*$, $H^*$ and $He^+$ in a relatively short time. For example, a linear plasma device could be used where the plasma is created at one end of the device and transported to the other end of the device. Typically a $LaB_6$ cathode is heated so that e– are emitted to ionize a gas such as $H_2$, Ar, or He. The plasma density can be considerable but the temperature is usually less than 10eV. A sample can be biased negatively in this plasma to set the net ion energy to the surface.

The foregoing description is in terms of a process using helium but other relatively inert, immobile gases such as argon or neon may be used as well as non-inert gases.

Figure 4:
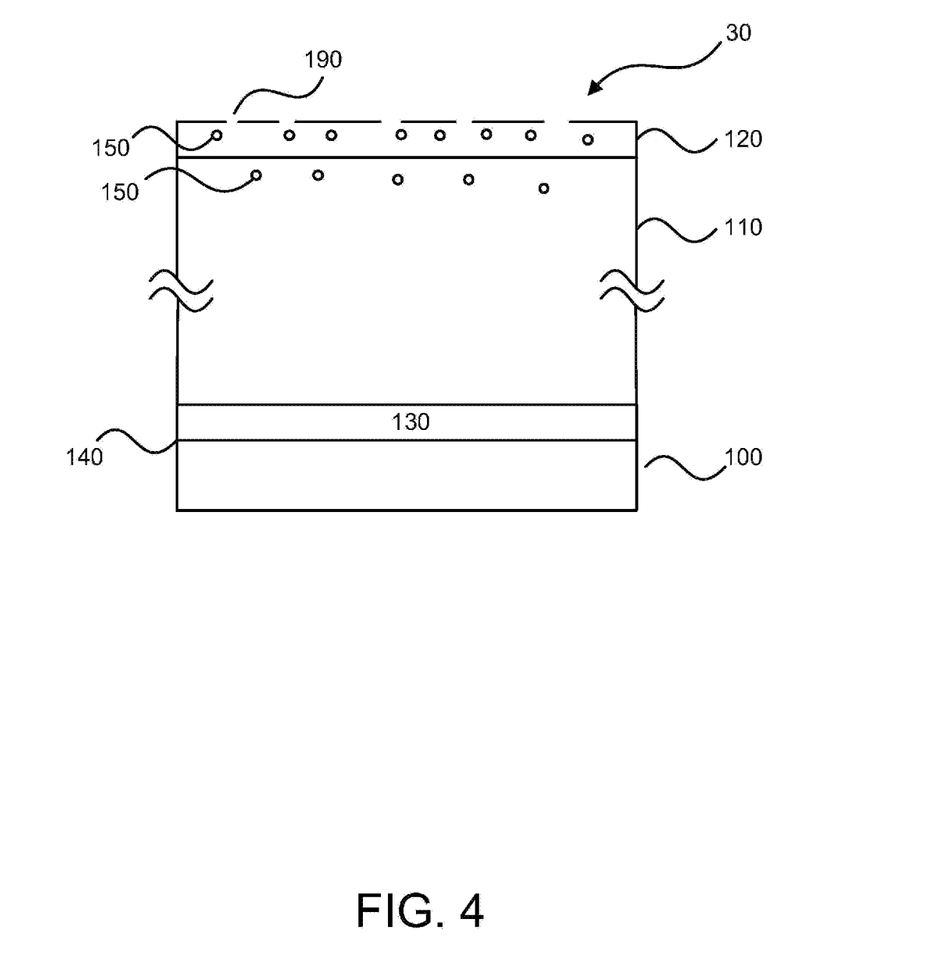
FIG. 4 is a schematic, not-to-scale diagram of a cross section of an EUV optical element showing very small (nm-μm) scratches and other damage to the surface of the EUV optical element with helium species (e.g., ions or energetic neutrals) being implanted near the surface of the EUV optical element to limit or prevent hydrogen adsorption and diffusion.

The foregoing principles can also be applied to repair or for prophylactic treatment of an EUV optical element using helium exposure implantation. As shown in FIG. 4, the EUV optical element may have minute damage (e.g., scratches/ damage on a nm-μm scale) to its surface. This damage is depicted in FIG. 4 as breaks 190 in the top surface of the collector 30. The collector 30 is described here as an example but the principles described here can be applied to other EUV optical elements as well. Using the principles of the invention He 150 may be implanted near surface of the collector 30 to inhibit or prevent FI adsorption and diffusion. Exposing the collector 30 to He species fluxes from time-to-time (e.g., at set intervals) to drive H out and replace it with He is also possible and can reduce the likelihood of damage caused by hydrogen-driven causes. In the embodiment of FIG. 4 a capping layer 120 is present and is implanted but if a capping layer 120 is not used then the ion implantation can be directly into the top surface of the MLM stack 110.

Figure 5:
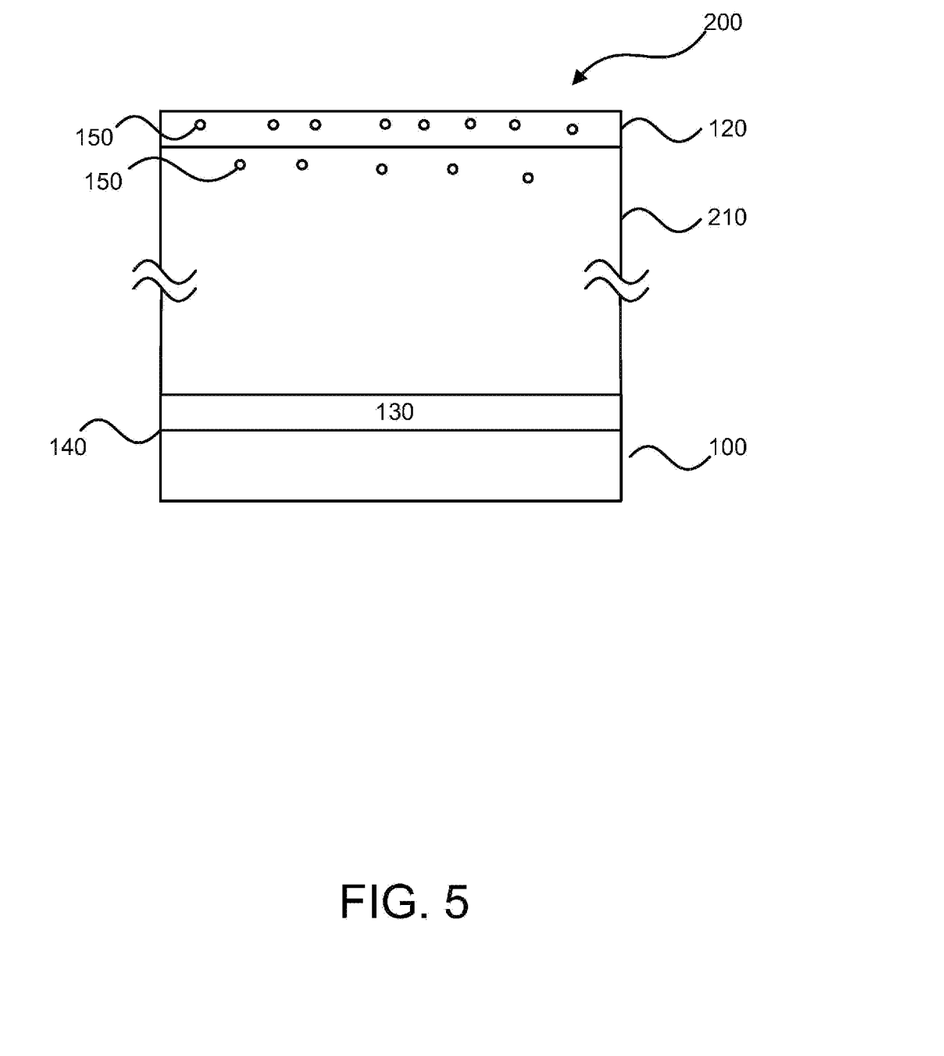
FIG. 5 is a graph depicting the results of a sample calculation of ion ranges according to an aspect of an embodiment.

As mentioned, the principles of the invention can be advantageously applied to EUV optical elements in addition to those implemented as an MLM. For example, the principles of the invention may be applied to grazing incidence minors not implemented as an MLM. It can also be applied before or after exposure to reticles and to protecting EUV masks and to the pellicle used as a protective cover for optics in the chamber 26. It can also be used in applications where hydrogen diffusion or embrittlement is a problem, such as liners, vanes, and components of droplet generators. This is shown in FIG. 5, in which an EUV component 200 is implanted with helium atoms or ions 150. The EUV component 200 may be an optical element such as a mirror or reticle or may be another component such as a pellicle, liner, vane, or droplet generator component. The EUV component 200 is shown as having a capping layer 120, a bulk material layer 210, a backing layer 130, and a substrate 100, but the capping layer 120, backing layer 130, and substrate 100 may or may not be present depending on the particular type of EUV component involved. If a capping layer 120 is present then helium implantation can occur in the capping layer 120 in addition or as an alternative to helium implantation in the bulk material layer 210. If a capping layer 120 is not present then helium implantation can occur in the bulk material layer 210. If a substrate 100 is present then the helium implantation process may involve additional steps such as thermal annealing of the substrate 100 and desorption of the substrate 100 before or after introduction of the helium species.

As an example, uncoated Cu optics can also be prone to damage by a similar blistering problem. He implantation and/or regular exposure to a He flux may also be used to provide such optics with a longer useful lifetime. An upper surface implanted with ions from a gas such as helium could also replace or supplement coatings that are currently used in EUV optical elements.

The principles of the invention can also be applied to components of inspection systems such as actinic inspection systems that are exposed to hydrogen and to components of optical instruments such as microscopes used to inspect an EUV mask.

The above description includes examples of one or more embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is construed when employed as a transitional word in a claim. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

What is claimed is:

1. Apparatus comprising a component of a system for generating EUV radiation, the component being exposed to hydrogen ions during operation of the system for generating EUV radiation, the component including a hydrogen diffusion barrier comprising a region implanted with species of an inert.

2. Apparatus as claimed in claim 1 therein the species of the inert gas comprises ions of the inert gas.

3. Apparatus as claimed in claim 2 wherein the ions of the inert gas comprise helium ions.

4. Apparatus as claimed in claim 1 wherein the species of the inert gas comprises energetic neutral atoms of the inert gas.

5. Apparatus as claimed in claim 4 wherein the energetic neutral atoms of the non-hydrogen gas comprise energetic neutral atoms of an inert gas.

6. Apparatus as claimed in claim 4 wherein the energetic neutral atoms of the inert gas comprise energetic neutral helium atoms.

7. Apparatus as claimed in claim 1 wherein the component comprises at least a portion of a collector mirror.

8. Apparatus as claimed in claim 7 wherein the collector mirror s a normal incidence mirror.

9. Apparatus as claimed in claim 7 wherein the collector mirror is a multilayer mirror.

10. Apparatus as claimed in claim 1 wherein the component comprises at least a portion of one of a reticle, a detector, a microscope, an inspection system, a pellicle, a vacuum chamber liner, a vacuum chamber vane and a droplet generator.

11. Apparatus as claimed in claim 1 wherein the inert gas comprises helium.

12. Apparatus as claimed in claim 1 wherein the inert gas comprises argon.

13. Apparatus as claimed in claim 1 wherein the inert gas comprises neon.

14. A multilayer mirror for use in a system for generating EUV radiation, the multilayer mirror being exposed to hydrogen ions during operation of the system for generating EUV radiation, the multilayer mirror comprising:
   a substrate;
   a backing layer on the substrate; and
   a multilayer coating on the backing layer,
   wherein one of the backing layer and the multilayer coating includes a hydrogen diffusion barrier comprising a region implanted with species of a inert gas.

15. A multilayer mirror as claimed in claim 14 wherein the species of the inert gas comprises ions of the inert gas.

16. A multilayer mirror as claimed in claim 14 wherein the species of the inert gas comprises energetic neutral atoms of the inert gas.

17. A multilayer mirror as claimed in claim 14 wherein the inert gas comprises helium.

18. Apparatus as claimed in claim 14 wherein the inert gas comprises neon.

19. Apparatus as claimed in claim 14 wherein the inert gas comprises argon.

20. A multilayer mirror for use in a system for generating EUV radiation, the multilayer mirror being exposed to hydrogen ions during operation of the system for generating EUV radiation, the multilayer mirror comprising:
   a substrate; and
   a coating on the substrate, the coating comprising a plurality of layers,
   wherein at least one layer of the plurality of layers is implanted with a species of an inert gas.

21. A multilayer mirror as claimed in claim 20 wherein the species of the inert gas comprises ions of the inert gas.

22. A multilayer mirror as claimed in claim 20 wherein the species of the inert gas comprises energetic neutral atoms of the inert gas.

23. A multilayer mirror as claimed in claim 20 wherein the inert gas comprises helium.

24. Apparatus for semiconductor photolithography or inspection comprising:
   a laser radiation source;
   a target delivery system for delivering target material to an irradiation region where the target material is irradiated by the laser radiation source to produce extreme ultraviolet radiation; and
   a reflective optical element arranged to collect the extreme ultraviolet radiation, the reflective optical element comprising a multilayer mirror including a multilayer stack and a backing layer, wherein at least one of the multilayer stack and the backing layer include a hydrogen diffusion barrier comprising a region implanted with species of an inert gas.

25. Apparatus as claimed in claim 24 wherein the species of inert gas comprises ions of the inert gas.

26. Apparatus as claimed in claim 24 wherein the species of inert gas comprises energetic neutral atoms of the inert gas.

27. Apparatus as claimed in claim 24 wherein the inert gas comprises helium.

28. A method of making component of a system for generating EUV radiation, the component being exposed to hydrogen ions during operation of the system for generating EUV radiation, the method comprising the step of implanting species of an inert gas in at least a portion of the component to form a hydrogen diffusion barrier in the component.

29. A method as claimed in claim 28 wherein the species of the inert gas comprises ions of an inert gas.

30. A method as claimed in claim 28 wherein the species of the inert gas comprises energetic neutral atoms of an inert gas.

31. A method as claimed in claim 28 wherein the inert gas comprises helium.

32. A method as claimed in claim 28 wherein the implanting step comprises controlling the implantation energy of the species to control an average depth of the hydrogen diffusion barrier in the component.

33. A method of treating a multilayer mirror for use in, a system for generating EUV radiation, the multilayer mirror being exposed to hydrogen ions during operation of the system for generating EUV radiation, the method comprising the steps of:
   removing a multilayer coating of the multilayer mirror to expose a backing layer;
   implanting species of an inert gas in the backing layer; and
   placing a multilayer coating on the backing layer.

34. A method as claimed in claim 33 wherein the inert gas comprises helium.

35. A method as claimed in claim 33 wherein the implanting, step comprises controlling the implantation energy of the species to control an average implantation depth of the species in the backing layer.

36. A method of treating an EUV optical element for use in a system for generating EUV radiation, the EUV optical element being exposed to hydrogen ions during operation of the system for generating EUV radiation, the method comprising the step of implanting species of an inert gas in the EUV optical element to prevent hydrogen adsorption and diffusion in the EUV optical element.

37. A method as claimed in claim 36 wherein species of an inert gas comprises ions of an inert gas.

38. A method as claimed in claim 36 wherein species of an inert gas comprises energetic neutral atoms of an inert gas.

39. A method as claimed in claim 36 wherein the inert gas comprises helium.

40. A method as claimed in claim 36 wherein the implanting step comprises controlling the implantation energy of the species to control an average implantation depth of the species in the component.

41. A method of treating component for use in a system for generating EUV radiation, the component having been exposed to hydrogen ions during operation of the system for generating EUV radiation, the method comprising the step of subjecting the component to a flux of inert gas species to displace hydrogen ions in at least a portion of the component with the non-hydrogen gas species so that the inert gas species protects the multilayer EUV optical element against hydrogen damage.

42. A method as claimed in claim 41 wherein the insert gas species comprises ions of an inert gas.

43. A method as claimed in claim 42 wherein the inert gas ions comprise helium ions.

* * * * *

UNITED STATES PATENT AND TRADEMARK OFFICE
CERTIFICATE OF CORRECTION

PATENT NO.         : 10,128,016 B2
APPLICATION NO.    : 15/338835
DATED              : November 13, 2018
INVENTOR(S)        : Umstadter

Page 1 of 1

It is certified that error appears in the above-identified patent and that said Letters Patent is hereby corrected as shown below:

In the Claims

Column 11, Line 12 reads an inert.
Should read "an inert gas."

Signed and Sealed this
Second Day of April, 2019

Andrei Iancu
*Director of the United States Patent and Trademark Office*